United States Patent [19]

Kumasaka et al.

[11] Patent Number: 4,554,655
[45] Date of Patent: Nov. 19, 1985

[54] OPTICAL DATA RECORDING DISC AND SYSTEM

[75] Inventors: Osamu Kumasaka, Yamanashi; Teruo Touma, Tokyo, Japan

[73] Assignee: Pioneer Video Corporation, Yamanashi, Japan

[21] Appl. No.: 469,053

[22] Filed: Feb. 23, 1983

[30] Foreign Application Priority Data

Feb. 24, 1982 [JP] Japan ................................. 57-28342

[51] Int. Cl.⁴ .......................... G11B 25/04; G11B 7/00
[52] U.S. Cl. ..................................... 369/275; 369/283; 369/286; 369/288; 369/284; 346/135.1; 346/76 L
[58] Field of Search ............... 364/275, 284, 283, 288, 364/286; 346/76 L, 135.1; 365/126–127; 430/945, 270

[56] References Cited

U.S. PATENT DOCUMENTS

| | | | |
|---|---|---|---|
| 3,665,483 | 5/1972 | Becker et al. | 369/275 |
| 4,278,756 | 7/1981 | Bouldin et al. | 346/76 L |
| 4,347,300 | 8/1982 | Shimazu | 430/270 |
| 4,414,059 | 11/1983 | Blum et al. | 430/945 |
| 4,430,401 | 2/1984 | Wilkinson | 430/945 |

FOREIGN PATENT DOCUMENTS 154196 12/1980 Japan ................................. 346/76 L

*Primary Examiner*—Robert L. Richardson
*Attorney, Agent, or Firm*—Sughrue, Mion, Zinn, Macpeak & Seas

[57] ABSTRACT

An optical data recording disc has a protrusion forming layer which is formed on a gas generating metal layer, and the gas generating metal layer, in turn, is formed on an optically polished disc. An optical beam is modulated by data and impinges on the gas generating metal layer, which locally evaporates the metal layer to form a gas. The gas expands and produces protrusions in the protrusion forming layer, and these protrusions are representative of the data. Accordingly, because the protrusions are formed essentially simultaneously with the recording operation, it is possible to reproduce the data being recorded immediately after the data is recorded so that failures in a recording device or in the optical data recording disc can be detected immediately.

10 Claims, 4 Drawing Figures

OPTICAL DATA RECORDING DISC AND SYSTEM

BACKGROUND OF THE INVENTION

1. Field of the Invention

The present invention relates to an optical data recording disc on which video or audio data signals are recorded with the aid of a laser beam.

2. Description of the Prior Art

A conventional optical data recording disc has a positive type, photo-resist layer formed on the surface of a glass disc which has been optically polished to a thickness of $\lambda/4n$, where $\lambda$ is the wavelength of the reproducing light source, and n is the refractive index of the reproducing disc material. A laser beam is applied onto the recording disc, and the laser beam is modulated with data signals. Subsequently, the recording disc is developed, which results in the formation of pits in the photo-resist layer surface which correspond to the data signals. Accordingly, the recorded signals cannot be reproduced simultaneously with or immediately after the signal recording because it is necessary to develop the recording disc separately. As a result, if a failure occurs during the recording operation, e.g., the recording device fails to operate properly or the disc is defective, the failure cannot be detected until the recording disc is developed. Therefore, when a failure occurs, useless work continues to be performed, and this is not cost effective.

Japanese Patent Application Publication No. 65340/1981 discloses an optical recording medium which has a three-layer structure, the first layer being a light reflecting layer, the second being a light transmitting layer, and the third being a light absorbing layer. The light transmitting layer is made of an organic material which is molten, decomposed or sublimated at a temperature of at least 300° C. below a melting point of the material of the light absorbing layer. A recording light beam applied to the recording medium is absorbed by the light absorbing layer and melts the light transmitting layer so that the light absorbing layer is pushed upward. Accordingly, the data are recorded in the form of bubbles. The light reflecting layer reflects the recording light beam, thus increasing the sensitivity of the recording medium.

Using the recording medium described above, data can be recorded and simultaneously reproduced. However, because of the three-layer structure, a number of manufacturing steps are required to produce this recording medium, thus resulting in unduly high manufacturing costs.

SUMMARY OF THE INVENTION

Accordingly, an object of the present invention is to eliminate the above-described drawbacks which accompany a conventional optical data recording medium. More specifically, an object of the present invention is to provide an optical data recording disc which is relatively inexpensive to manufacture and on which data signals can be reproduced immediately after being recorded. The recording disc of the present invention contains a gas generating metal layer and a protrusion forming layer which forms protrusions with the aid of gas generated by the gas generating layer, the protrusions being representative of the data being recorded.

DESCRIPTION OF THE PREFERRED EMBODIMENT

Figure 1:
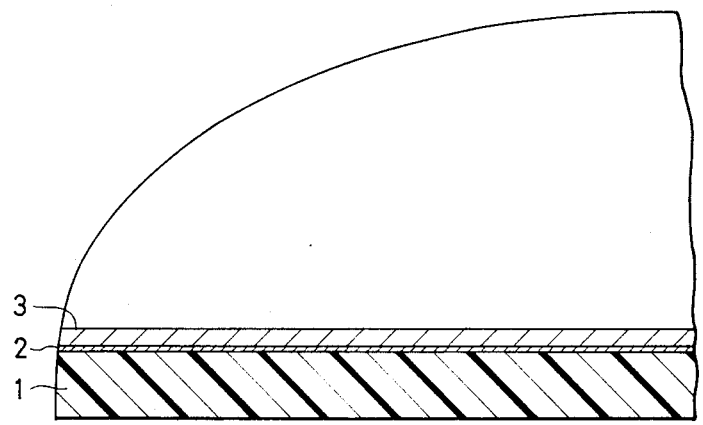
FIG. 1 is a sectional view showing a part of an optical data recording disc according to the present invention.
Figure 2:
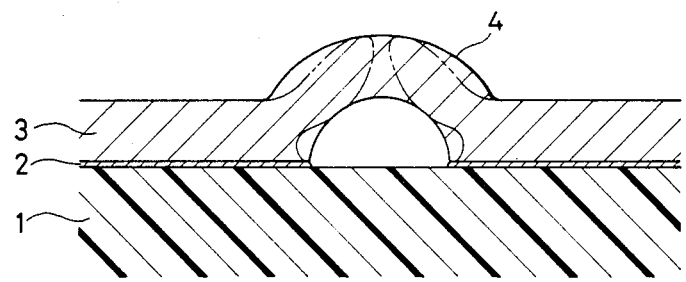
FIG. 2 is an enlarged, sectional view of essential parts of the recording disc which shows how data signals are recorded on the disc.

In FIGS. 1 and 2 a disc 1, which is made of glass or a plastic such as polymethyl methacrylate, polycarbonate, or vinyl chloride, has a surface which has been optically polished. A metal film 2, which has a thickness of 200 Å or less, is formed on the surface of the disk 1 by evaporation, sputtering or a similar process. The metal film 2 preferably is made of a material which has a low melting point and a low thermal conductivity, such as Cr, Al, Te, Bi, Ag, Pb or Sn, or alloys of these metals. A protrusion forming layer 3 is formed on the metal film 2 by applying a highly malleable photo-resistive material to the metal film 2, in a predetermined thickness, by an ordinary method such as a spin coat method. It is desirable that the thickness of the layer 3 be $\lambda/4n$, where $\lambda$ is the wavelength of the reproducing light source, and n is the refractive index of the reproducing disc material. Almost all macromolecular materials (such as organic materials), except for "Teflon", polyethylene, polystyrene or the like which do not dissolve in a solvent, can be used as the protrusion forming layer.

By way of example, a method of recording data signals, such as video or audio signals, on the data recording disc constructed according to the present invention using a conventional recording device will be described.

Figure 3:
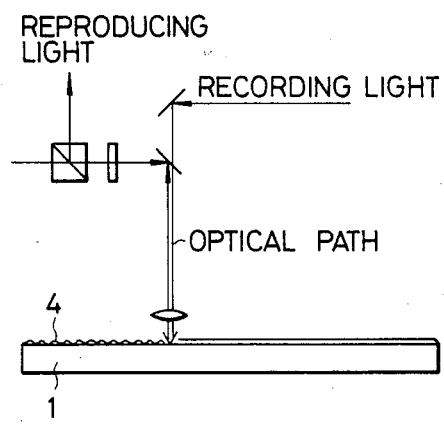
FIGS. 3 and 4 are explanatory diagrams showing examples of a device for reproducing the data signals recorded on the recording disc.
Figure 4:
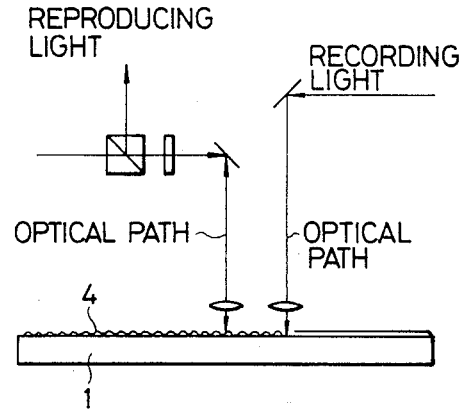

The data recording disc is rotated by a recording disc rotating motor, and data signals are recorded on the disc using a laser beam, beginning with an innermost toward an outermost spiral track. The laser beam is modulated by the data signals and converged onto the metal film 2. A portion to which the laser beam is applied is locally evaporated through vaporization by the heat of the laser beam in response to the data signals. The vaporized metal vapor expands and pushes the photoresist layer 3 upward, thus forming protrusions 4 on the disc 1 which correspond to the data signals in such a manner that the protrusions are spirally lined. At the same time, the photo-resist layer 3 is exposed by the laser beam, so the data signals are also recorded on the photo-resist layer 3 itself. The protrusions 4 are formed simultaneously as the recording operation (application of the laser beams) is carried out. Therefore, if another reproducing laser beam is immediately applied to the data recording disc by a laser pickup, the recorded data can be reproduced by detecting the difference between the amount of light reflected from each protrusion 4 and the amount of light reflected from the other surface areas of the data recording disc. In this case, it should be noted that the wavelength of the reproducing laser beam is different from that of the recording laser beam, for avoiding unwanted exposure of the photo-resist layer 3. In reproducing the data, a part of the reproducing optical path may be utilized as the recording optical path, as shown in FIG. 3, or the reproducing optical path and the recording optical path may be independent of each other, as shown in FIG. 4.

If, in the recording operation, the metal film 2 is relatively thick, and a relatively large amount of metal vapor is thus evaporated and expands, the metal vapor may break the photo-resist layer 3, as indicated by the chain lines in FIG. 2. This, obviously, would make it difficult to control the configuration of the protrusions 4. Accordingly, the thickness of the metal film 2 should be 200 Å or less, and the desirable thickness is generally on the order of 70 Å; however, it depends on the thickness of the photo-resist layer 3.

The metal film 2, which serves as the gas generating layer, should preferably have a low melting point and a low thermal conductivity. The metal film 2 is formed on the disc 1, which is made of glass or the like, and the protrusion forming layer 3 is formed on the metal film 2 by coating to a predetermined thickness. The laser beam is applied to the metal film 2 to vaporize the latter locally so that the expanded metal vapor pushes up the protrusion forming layer 3, thus forming the protrusions 4 on the disc which correspond to the data signals. Therefore, the invention has the following effects or merits:

The protrusions 4 formed on the recording disc can be utilized directly for copying by way of an electroplating process. If the protrusions 4 are utilized directly for copying, then the unstable developing process is eliminated. Also, because the reproducing operation can be carried out while the recording operation is conducted, the sensitivity and accuracy of the recording operation can be improved by feeding the reproduced data back to the recording device. Accordingly, when recording fails because the recording device is out of order or the original optical data recording disc is defective, the failure can be detected immediately, and useless work can thus be prevented.

The operation of coating the optical data recording disc with the photo-resist layer 3 is completely the same as that used in making the conventional recording disc. Therefore, there is no difficulty for producing the recording disc according to the invention. A relief for replication can be formed from the recording disc of the present invention by development because protruded photo-resist layer 3 is also containing the data signals in the form of the change in chemical characteristics which is caused by the exposure. So there is no difference between the recording disc of the invention and the conventional recording disc, for replication after the developing process is finished. Since reproduction data from the protrusions 4 are related to the reproduction data from pits which are formed on the photo-resist layer 3 after the developing process, the production data from the pits can be estimated from the reproduction data from the protrusions 4 before the development.

The metal film 2 serves as an excellent adhesive between the disc 1 and the photo-resist layer 3. Accordingly, the original disc of the present invention is of a simple, dual-layer structure in which a so-called "binder" layer is eliminated. Therefore, the optical characteristics are maintained high, the number of manufacturing steps is reduced, and the recording disc of the present invention has a low manufacturing cost. Furthermore, the protrusion forming layer is made of an organic material which is high in malleability. Therefore, a small amount of generated gas can form the protrusions with high efficiency, thus providing excellent data recording characteristics.

We claim:

1. An optical data recording disc, comprising:
   an optically polished disc;
   a gas generated metal layer formed on said disc; and
   a protrusion forming layer formed on said gas generating metal layer, said gas generating metal layer being evaporated to produce a gas by an optical beam having an intensity modulated by data, said gas forming protrusions in said protrusion forming layer which are representative of said data, said metal layer acting as an adhesive between said optically polished disc and said protrusion forming layer.

2. The optical data recording disc as claimed in claim 1, wherein said protrusion forming layer is made of a ductile, organic material.

3. The optical data recording disc as claimed in claim 2, wherein said protrusion forming layer is a photo-resist layer which can be treated to form a further disc for replication.

4. The optical data recording disc as claimed in claim 1, wherein said optically polished disc is made of glass or plastic.

5. The optical data recording disc as claimed in claim 4, wherein said plastic is polymethyl methacrylate, polycarbonate, or vinyl chloride.

6. The optical data recording disc as claimed in claim 1, wherein said protrusion forming layer has a thickness of $\lambda/4n$ where $\lambda$ is a wavelength of a reproducing light source and n is a refractive index of a reproducing disc material.

7. The optical data recording disc as claimed in claim 1, wherein said protrusion forming layer is a macromolecular material which is capable of being dissolved in a solvent.

8. The optical data recording disc as claimed in claim 1, wherein said gas generating metal layer has a thickness of no more than 200 Å.

9. The optical data recording disc as claimed in claim 1, further comprising means for reproducing said data from said optical data recording disc and feeding said reproduced data back to a recording device which generates said optical beam.

10. The optical data recording disc as claimed in claim 8, wherein said gas generating metal layer is Cr, Al, Te, Bi, Ag, Pb or Sn, or alloys thereof.

* * * * *